United States Patent
Prasse

(10) Patent No.: US 7,725,212 B2
(45) Date of Patent: May 25, 2010

(54) DATACENTER WITH AUTOMATED ROBOTIC MAINTENANCE

(75) Inventor: David Prasse, Cypress, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1207 days.

(21) Appl. No.: 11/255,819

(22) Filed: Oct. 21, 2005

(65) Prior Publication Data
US 2007/0094535 A1    Apr. 26, 2007

(51) Int. Cl.
    G06F 7/00    (2006.01)
(52) U.S. Cl. ............................ 700/214; 700/218
(58) Field of Classification Search ............. 700/213, 700/214, 218, 228, 215, 222
    See application file for complete search history.

(56) References Cited

U.S. PATENT DOCUMENTS

| | | | |
|---|---|---|---|
| 5,028,766 A | 7/1991 | Shah | |
| 5,036,465 A | 7/1991 | Ackerman, Jr. et al. | |
| 5,036,466 A | 7/1991 | Fitzgerald et al. | |
| 5,214,748 A | 5/1993 | Wakayama et al. | |
| 5,303,214 A * | 4/1994 | Kulakowski et al. | 369/30.3 |
| 5,307,271 A | 4/1994 | Everett, Jr. et al. | |
| 5,318,143 A | 6/1994 | Parker et al. | |
| 5,455,409 A * | 10/1995 | Smith et al. | 235/385 |
| 6,681,147 B2 | 1/2004 | Carlson | |
| 6,744,362 B2 | 6/2004 | Carlson | |
| 6,747,229 B2 | 6/2004 | Carlson | |
| 6,751,040 B2 | 6/2004 | Gupta et al. | |
| 7,277,247 B2 * | 10/2007 | Hoshino | 360/69 |
| 7,642,914 B2 * | 1/2010 | Campbell et al. | 340/572.1 |
| 2004/0243280 A1 | 12/2004 | Bash et al. | |
| 2005/0010499 A1 | 1/2005 | Farkas et al. | |
| 2005/0038562 A1 | 2/2005 | Bash et al. | |
| 2006/0262447 A1 * | 11/2006 | Hoshino | 360/69 |

* cited by examiner

*Primary Examiner*—Gene Crawford
*Assistant Examiner*—Ramya Prakasam

(57) ABSTRACT

A datacenter with automated robotic maintenance comprises: a plurality of computer systems disposed at different locations therein, each system including: a cabinet rack; and a plurality of system cell units disposed therein for operation of the corresponding computer system; a robotic vehicle operative to move to each of the cabinet racks of the plurality and to perform maintenance on the system cell units thereof; and a central management station operative to communicate with the plurality of computer systems to determine an occurrence of a maintenance event for a system cell unit at one of the computer systems, and operative to direct the robotic vehicle to move to the cabinet rack of the one computer system and to perform maintenance on the system cell unit in accordance with the maintenance event.

26 Claims, 10 Drawing Sheets

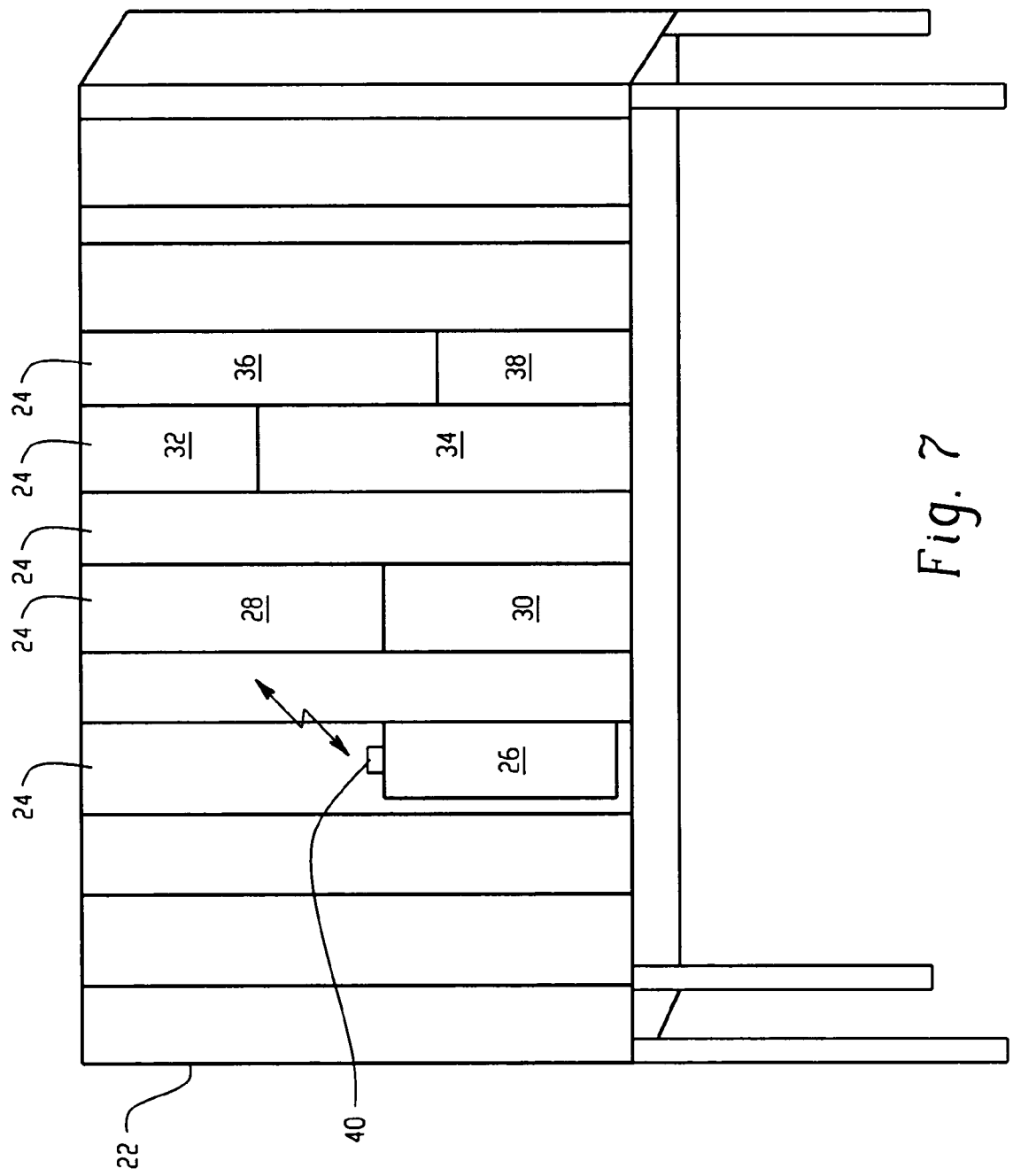

DATACENTER WITH AUTOMATED ROBOTIC MAINTENANCE

BACKGROUND

A datacenter is generally a room containing a plurality of cabinet racks of computer systems, like computer servers, for example. For high end computer servers, each cabinet rack may comprise from two to sixty-four cell/memory units, which are commonly referred to as boards. Each board may have a unique identification (ID). A exemplary datacenter is described in the co-pending U.S. patent application Ser. No. 10/614,856, filed Jul. 9, 2003 and published Jan. 13, 2005, entitled "Inventory Management of Components" and assigned to the same assignee as the instant application, which application being incorporated by reference herein in its entirety.

Currently, the higher end computer servers have self-diagnostic capabilities for identifying a failed board. However, maintenance of the failed server remains a manual process. Typically, the failed server sends a failure notification to a system or service administrator which includes the ID of the failed board or unit. The administrator may or may not be local to the datacenter. If remote from the datacenter, the notification may be an email message, for example. For the most part, datacenters do not include a storage inventory of the different types of replacement boards. Accordingly, in such cases, upon receipt of a failure notification, the administrator knowing the ID of the failed board will order a replacement unit and have it shipped to the datacenter. A service technician will take the replacement unit to the failed server for manual replacement. The failed unit may have an indicator light for directing the technician to the failed unit.

Of course, for those servers that do not have self-diagnostics capabilities, the failed server will have to be identified by a service technician, for example. Then, diagnostics will be performed on the identified server to locate the failed board or boards. Thereafter, the manual procedure will remain the same or similar to that described above.

This manual procedure for maintaining the datacenter operational is rather onerous and time consuming, requiring one or more service technicians either on-duty or on-call. The lost operational time resulting from a failed server is also a consequential loss to the datacenter operator. Accordingly, an improvement to the manual operational maintenance of the datacenter is desired for at least the aforementioned reasons.

SUMMARY

In accordance with one aspect of the present invention, a datacenter with automated robotic maintenance comprises: a plurality of computer systems disposed at different locations therein, each system including: a cabinet rack; and a plurality of system cell units disposed therein for operation of the corresponding computer system; a robotic vehicle operative to move to each of the cabinet racks of the plurality and to perform maintenance on the system cell units thereof; and a central management station operative to communicate with the plurality of computer systems to determine an occurrence of a maintenance event for a system cell unit at one of the computer systems, and operative to direct the robotic vehicle to move to the cabinet rack of the one computer system and to perform maintenance on the system cell unit in accordance with the maintenance event.

BRIEF DESCRIPTION OF THE DRAWINGS

FIG. 7 is an isometric view illustration of an inventory shelf suitable for use in the datacenter of FIG. 1.

DETAILED DESCRIPTION OF THE INVENTION

Figure 1:
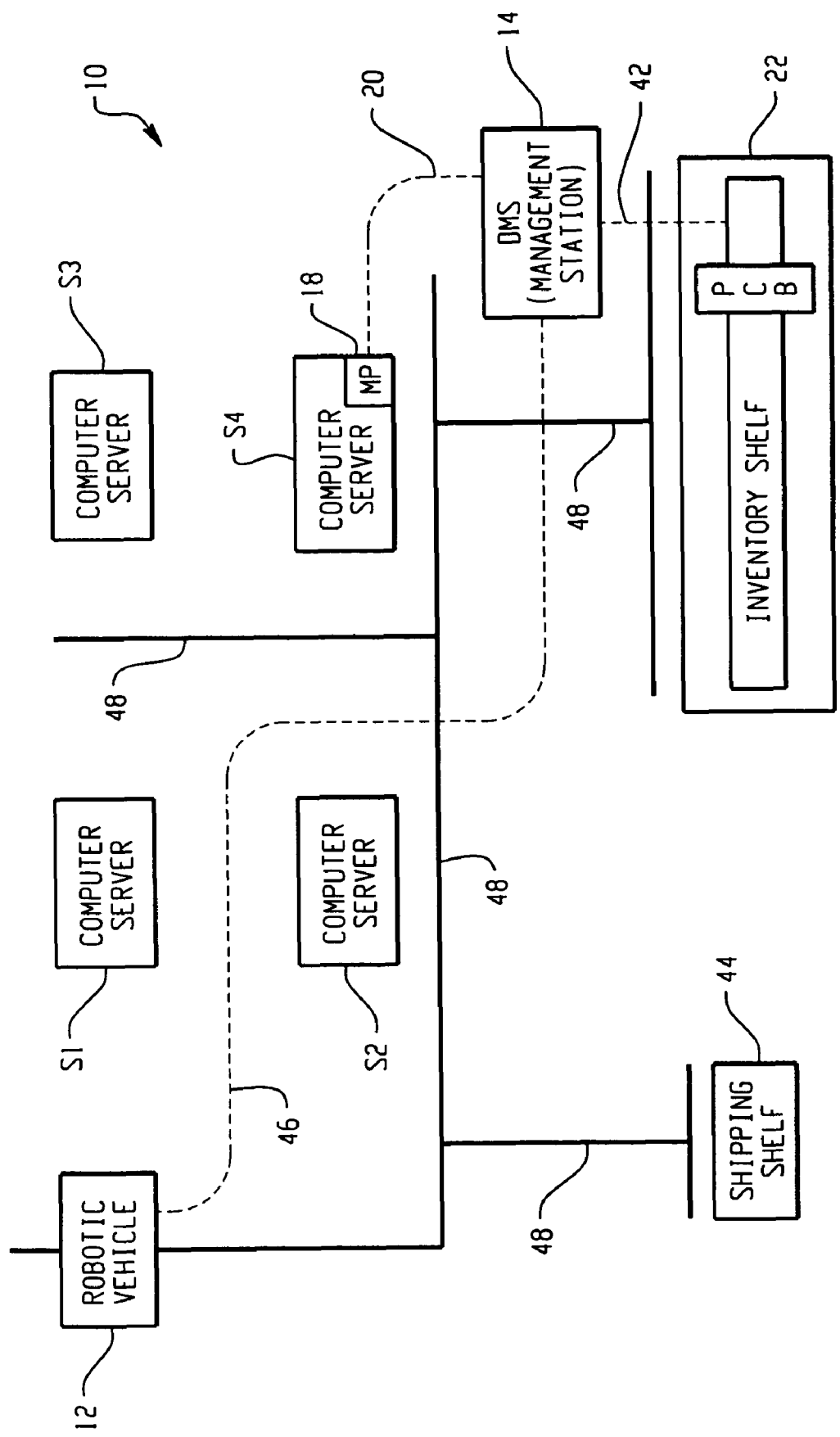
FIG. 1 is a block diagram schematic illustration of an exemplary datacenter with automated robotic maintenance.

An exemplary automated robotic datacenter 10 suitable for embodying the principles of the present invention is illustrated in the block diagram schematic of FIG. 1. Referring to FIG. 1, the datacenter 10 includes a plurality of computer server systems S1-S4 which may be similar to the computer servers disclosed in the co-pending application Ser. No. 10/614,856 referenced herein above. Each computer server S1-S4 comprises a cabinet rack of cell/memory units as described above. The datacenter 10 further includes a robotic vehicle 12 and a datacenter management station (DMS) 14. Each computer server system S1-S4 may be of one of the models manufactured by Hewlett-Packard (HP), like the models Superdome, rx8620-32, and/or rx4640-8, for example. Such computer servers may have a management processor (MP) 18 for performing self-diagnostics on the server system to identify a failed unit or board thereof.

In the present embodiment, the DMS 14, which may be a programmed workstation or personal computer (PC) manufactured by HP under the model nw8000, for example, is operative to monitor the systems S1-S4 in the datacenter 10 for notification of a failed board or unit and its ID via the management processor 18 of the failed server system, like S4, for example. A communication link, illustrated by the dot-dashed line 20, between the MP 18 of the failed system and the DMS may be either wireless or a wired cable, such as an Ethernet link, for example. Once the DMS 14 is alerted of the occurrence of a hardware failure event, i.e. a unit needs replacement, the DMS 14 is operative to notify the robotic vehicle 12 of the location of the failed system in the datacenter, by datacenter coordinates or system ID, for example, and the ID of the hardware unit that requires replacement.

The datacenter 10 may also include an inventory shelf or area 22 which is a storage area for spare units for the servers S1-S4 of the datacenter 10. An illustration of an exemplary inventory shelf 22 is shown in FIG. 7. Referring to FIG. 7, the inventory shelf 22 may be comprised of a plurality of slots 24 for storing the replacement boards 26 of the server systems S1-S4. The slots 24 may be partitioned vertically into different sections 28, 30, 32, 34, 36 and 38 for storing boards of different sizes vertically in the slots. In one embodiment, a radio frequency identification chip (RFIC) 40 may be attached to each the spare boards 26 of the inventory shelf 22. Each RFIC 40 may be programmed with the unique ID of the board to which it is attached and may transmit the board's ID over a wireless link to the DMS 14 as illustrated by the dot-dashed line 42 (FIG. 1).

Thus, the DMS 14 is operative to monitor the ID transmissions of the RFICs and maintain an inventory table database of the spare boards currently available at the inventory shelf from the board ID information it receives from each RFIC 40 at the inventory shelf 22. Accordingly, the DMS 14 may consult the inventory table in its database to determine if a spare board is available at the inventory shelf 22 prior to notifying the robotic vehicle 12. In addition, the system administrator may also communicate with the DMS 14 to gather inventory information at the datacenter.

The datacenter 10 may also include a shipping shelf 44 which is a storage area for failed units and receiving area for new replacement units as will become more evident from the following description. Preferably, the shipping shelf 44 is physically and logically separated from the inventory shelf 22. This is only a practical arrangement since the shipping shelf would be located in an area that leads to the shipping and packaging areas of the datacenter. As will become more evident from the following description, the DMS 14 may direct the robotic vehicle 12 to transport new inventory units from the shipping shelf 44 to the inventory shelf and to transport failed units from the failed server to the shipping shelf 44.

Referring back to FIG. 1, the DMS 14 has stored in its memory a database of the types of servers S1-S4 and the replaceable units for each type server. Thus, once the DMS 14 is alerted of a failed unit in a server, it determines the replacement unit needed and whether or not that unit is available at the inventory shelf. If available, it notifies the robotic vehicle 12 of the location of the failed system in the datacenter and the ID of the hardware unit that requires replacement. This communication link may be wireless as illustrated by the dot-dashed line 46. The DMS 14 may be "mirrored" for fault tolerant purposes.

Accordingly, the DMS 14 is the "brains" of the datacenter 10 for determining the state of the server systems, what has failed, and what is in inventory, and for controlling the robotic vehicle 12. The DMS 14 is also operative to request new inventory replacement units based on the available inventory and also alert the system administrator of activities, if so desired. In addition, reports may be run from the DMS 14 on available inventory at the shelf 22, units replaced within the past X days, weeks, . . . etc. or the state of each computer server S1-S4. Further, upon a failure and replacement, a report may be generated and printed to be sent along with the failed unit to provide details of the failure.

The robotic vehicle 12 of the present embodiment may be similar to the robotic vehicle described in the co-pending U.S. patent application Ser. No. 10/446,867, filed May 29, 2003 and published Dec. 2, 2004, entitled "Data Center Robotic Device"; and the co-pending U.S. patent application Ser. No. 10/639,428, filed Aug. 13, 2003 and published Feb. 17, 2005, entitled "Semi-Autonomous Operation of A Robotic Device", both of which being assigned to the same assignee as the instant application and both of which being incorporated by reference herein in their entirety. In the present embodiment, the robotic vehicle 12 may move along a predetermined tracking strip 48 laid down on the floor surface of the datacenter along paths running in close proximity to the computer server systems S1-S4, the inventory shelf 22 and shipping shelf 44.

In the alternative, absent the tracking strip 48, the robotic vehicle 12 may be trained to move through predetermined steps to established a plurality of learned datacenter paths from a known starting location to a destination location. The movement steps of each learned datacenter path may be pre-programmed into the robotic vehicle 12 as a robotic-task algorithm which may be performed by the robotic vehicle 12. Accordingly, when the robotic vehicle 12 is directed to move to a destination location under direction of the DMS 14, knowing its current location, it may perform the task algorithm of the appropriate learned datacenter path without the use of the tracking strip 48.

Figures 2A, 2B:
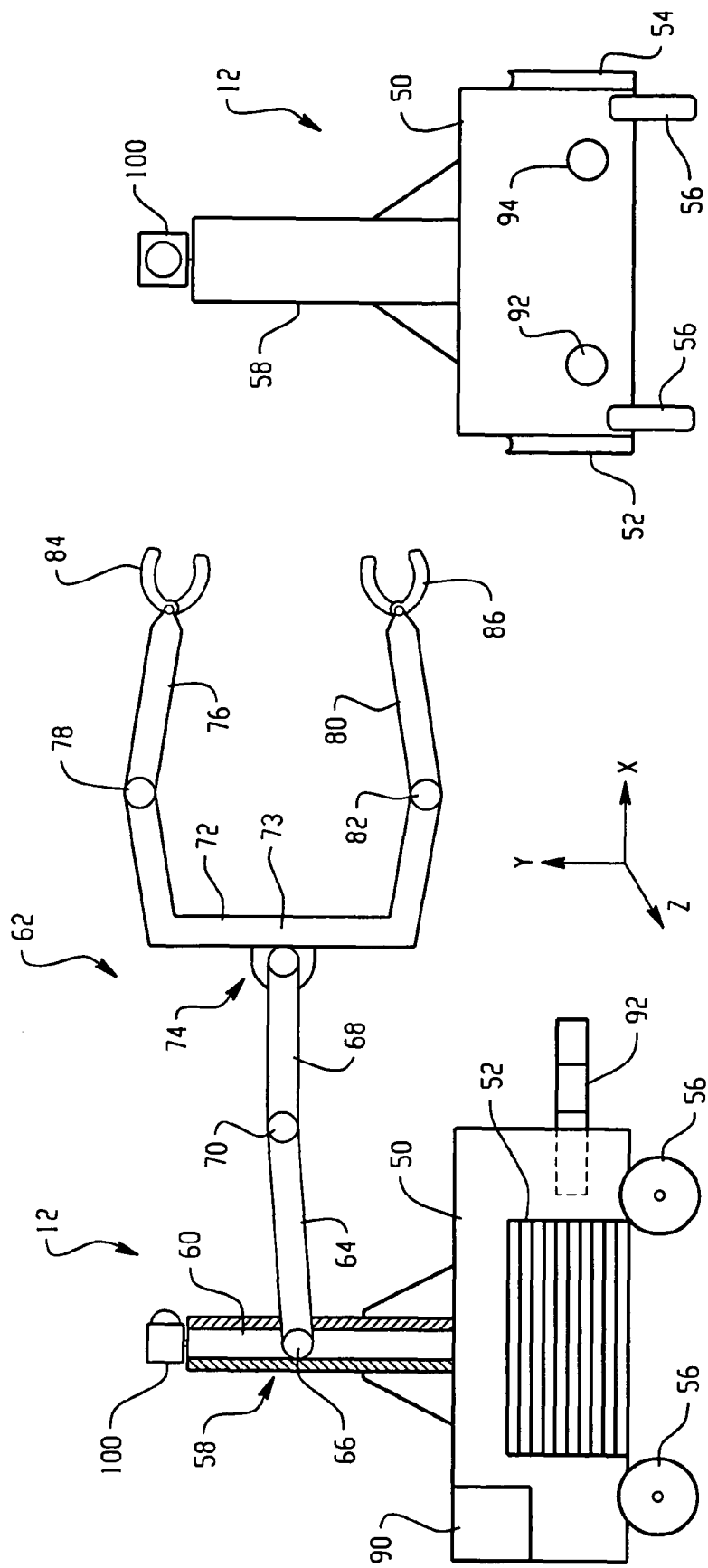
FIGS. 2A and 2B are side and front view illustrations, respectively, of an exemplary robotic vehicle suitable for use in the datacenter of FIG. 1.

An exemplary robotic vehicle 12 suitable for use in the present embodiment is shown in side view and front view illustrations of FIGS. 2A and 2B, respectively. The front view illustration of FIG. 2B does not show a robot arm. Referring to FIGS. 2A and 2B, the robotic vehicle (RV) 12 comprises a base structure 50 which may be in the shape of a parallelepiped, for example. Attached to both sides of the base structure 50 are containers 52 and 54 for carrying units of the systems S1-S4. For the present embodiment, the containers 52 and 54 may be of the metal wire screened cage type. The base structure 50 may rest on a set of wheels 56 which may be driven by one or more electric drive motors in the base 50, for example. The front wheels of the RV 12 may be controlled to swivel for RV guidance purposes.

Another structure 58 is fixedly supported in a vertical orientation on top of the base structure 50 and includes a channel 60 vertically disposed therein for supporting a robotic extension arm mechanism 62. The arm mechanism 62 may be controlled to move up and down along and within the channel 60. The arm mechanism 62 includes a first arm member 64 which is attached at one end to the channel 60 at a first joint 66 and at the other end to a second arm member 68 at a second joint 70. The arm member 68 is attached at its other end to a center point 73 of a U-shaped member 72 through a universal joint 74 which permits 360° rotational movement of the member 72 about X, Y and Z coordinate axes referenced to the member 68. One end of the U-shaped member 72 is attached to a third arm member 76 at a third joint 78 and the other end of the U-shaped member 72 is attached to a fourth arm member 80 at a fourth joint 82.

At the other end of the member 76 is attached a first gripper or hand 84 which is operative to open and close to grasp objects, like the server units. At the other end of the member 80 is attached a second gripper or hand 86 which is operative to open and close to grasp objects like the hand 84. The robotic arm mechanism 62 and its associated members and grippers described above may be operated with servo motors controlled from a central control unit 90, which may be located at the base 50, to direct the arm mechanism 62 through various movements as will become more evident from the following description.

Further included in the base unit 50 may be a pair of robotic extender supports 92 and 94 which may be controlled to telescope out and retract into the front of the base unit 50. The extender supports 92 and 94 are used by the robotic vehicle 12 to align with a server system and provide support to the robotic vehicle 12 when extracting or inserting a board unit as will become better understood from the description found herein below.

Also in the present embodiment, the robotic vehicle 12 includes an image capturing device 100 which may be a camera, for example, disposed on top of the vertical structure 58. The camera 100 may be controlled to move through various positions so as to view an image of what is needed to perform the task at hand of the robotic vehicle 12 and to generate electronic image frames of the view. For example, when the vehicle 12 is commanded to move to a location in the datacenter 10, the camera 100 may be controlled to view an image of the track 48 as a navigation guide for the desired vehicle movement. If the vehicle is commanded to obtain or drop off a unit, the camera 100 may be controlled to view an image of the area where the unit is to be obtained or deposited, like the shipping shelf or inventory shelf, for example. Another example may be if the vehicle 12 is commanded to extract and/or insert a unit into a slot of a server system cabinet rack as will be better understood from the description below, the camera 100 may be controlled to view an image of the front of the cabinet to permit alignment of the vehicle 12 with the cabinet, and then to view an image of the desired slot and/or unit in the cabinet for insertion and/or extraction of the unit.

Figure 3:
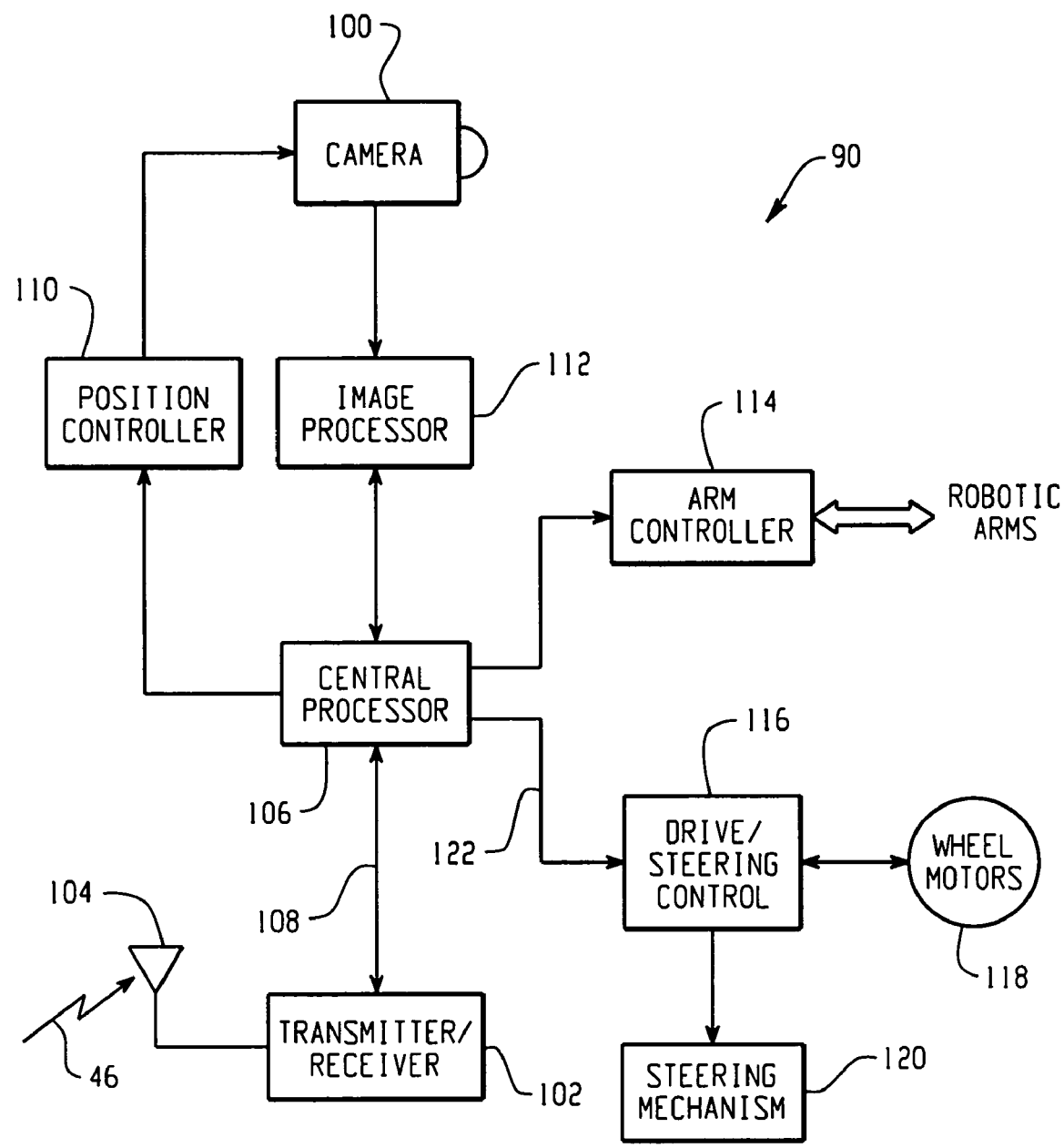
FIG. 3 is a block diagram schematic of an exemplary central control unit for the robotic vehicle.

A block diagram schematic of an exemplary central control unit 90 for the robotic vehicle 12 is shown in FIG. 3. Referring to FIG. 3, the unit 90 may include a transmitter/receiver circuit 102 with an antenna 104 for communicating wirelessly with the DMS 14 over link 46. The transmitter receiver circuit 102 may be coupled to a central processor circuit 106 over signal lines 108. The camera and assembly 100 is position controlled by the central processor 106 via a position controller 110. Image frames viewed and generated by camera 100 are processed by an image processor circuit 112 and conveyed to the central processor unit 106 autonomously or by request. The central processor 106 is operative to control the robotic arm mechanism 62 and the arm and gripper members thereof through an arm controller unit 114, and to control the drive and steering of the vehicle 12 through a drive and steering controller 116 and wheel motors 118 and steering mechanism 120.

In operation, the DMS 14 may issue commands to the robotic vehicle 12 over the wireless link 46. The commands are received via antenna 104 and receiver unit 102 and conveyed over signal lines 108 to the central processor 106 wherein the commands are interpreted to determine the task to be performed. Pre-programmed task algorithms may be stored in the memory of the processor 106 for use in controlling the robotic vehicle to a new location as well as the movement of the robotic arm mechanism 62. Once knowing the specific task to perform, if the camera 100 is to be used, the central processor 106 may position the camera 100 via controller 110 to view an image to assist with task performance.

To determine when the camera is in the desired position, the central processor 106 may request image frames viewed by the camera in an electronic picture element (pixel) format from the image processor 112 and process the pixels of the image frames by appropriate algorithms to determine when the camera 100 is correctly positioned. For example, if the task is to navigate the vehicle 12 to a new location, the camera 100 may be directed to the tracking strip 48 on the surface of the datacenter floor. Once the tracking strip 48 appears in the frame image, preferably image center, the camera 100 is considered positioned correctly for the task at hand. Thereafter, the central processor 106 may control the drive and steering of the vehicle 12 via controller 116, motors 118 and steering mechanism 120. The central processor 106 may generate the drive and steering signals 122 to the controller 116 during movement based on keeping the image of the track strip 48 in the center of the image frames, for example.

The central processor 106 may establish that the vehicle has reached its desired destination by monitoring the frame images and comparing them to a pre-stored image of the destination area which may be an indication or marking on the strip 48 being tracked, for example. Once the vehicle 12 arrives at its desired destination as determined by the central processor 106, the position of the camera 100 may be changed to view a different image for a different task, like controlling robotic arm mechanism 62 to obtain a unit at the inventory shelf 22. In this example, the camera 100 may be controlled to view the desired slot and/or unit in the shelf 22 which may be marked by an indicator, like a bar code, for example. Once the slot and unit are in the viewed image of the camera 100 as determined by the processor 106, the processor 106 may control the robotic arm mechanism 62 to grip the unit and extract it from the slot. Other examples of robotic tasks will be described in further detail in the following paragraphs.

Figure 4A:
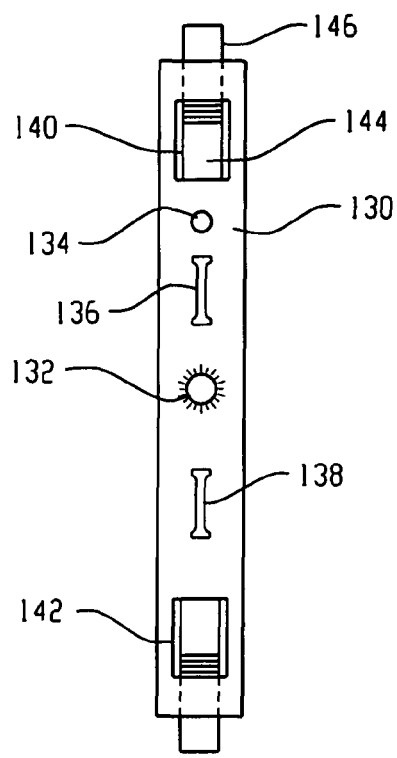
FIGS. 4A and 4B are front and side view illustrations, respectively, of an exemplary cell unit suitable for use in the datacenter of FIG. 1.
Figure 4B:
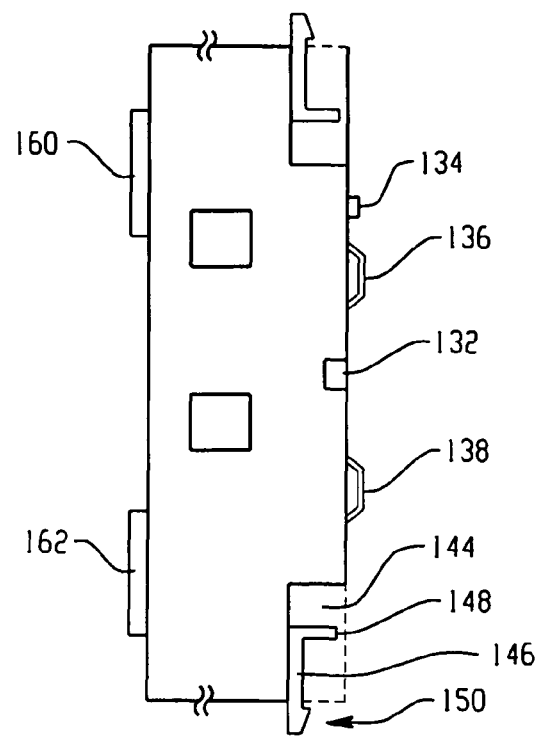

In the present embodiment, two of the tasks performed by the robotic vehicle 12 are to extract a failed unit from a server cabinet rack and to insert a replacement unit in its place. To accomplish these tasks, some mechanical robotic interface at the unit is needed. An exemplary unit including one type of a mechanical interface suitable for enabling the aforementioned tasks to be performed by the robotic vehicle 12 is shown in the front and side view illustrations of FIGS. 4A and 4B, respectively. Referring to FIGS. 4A and 4B, a front panel 130 of the exemplary unit includes an indicator 132, which may be a light or light emitting diode (LED), for example, for indicating, when lit or flashing, that the unit needs to be replaced. The indicator 132 may be used by the processor 106 to position the camera 100 of the RV 12 to view an image of the failed unit for extraction.

An eject or notify pushbutton 134 is also located on the panel 130 and connected electrically to the MP 18 of the server system. The pushbutton 134, when depressed, may provide a signal to the MP 18 that the associated failed unit is being extracted or removed from the server system or that a replacement unit has been inserted for power-up purposes. The MP 18 may convey this information to the DMS 18 via the wireless link 42. In addition, affixed to the front panel 130 are a pair of upper and lower handles, 136 and 138, respectively, which may be used respectively by the grippers 84 and 86 to move, extract and insert the unit according to the task at hand as will become more evident from the following description.

Upper and lower sliding lever mechanisms 140 and 142, respectively, are provided at the front panel 130 for securing the unit in place when inserted into its slot of the system cabinet rack. Each mechanism 140 and 142 includes a panel slot 144 for containing and slidably engaging a lever 146. At one end of lever 146 which remains in the slot 144 is a protrusion or lip 148 for use in sliding the lever 146 in the slot 144. The other end 150 of lever 146 which may be slid out from the slot 144 is tapered and notched to permit locking the unit in place when inserted into a slot of the cabinet rack as illustrated by way of example in FIG. 6.

Figure 6:
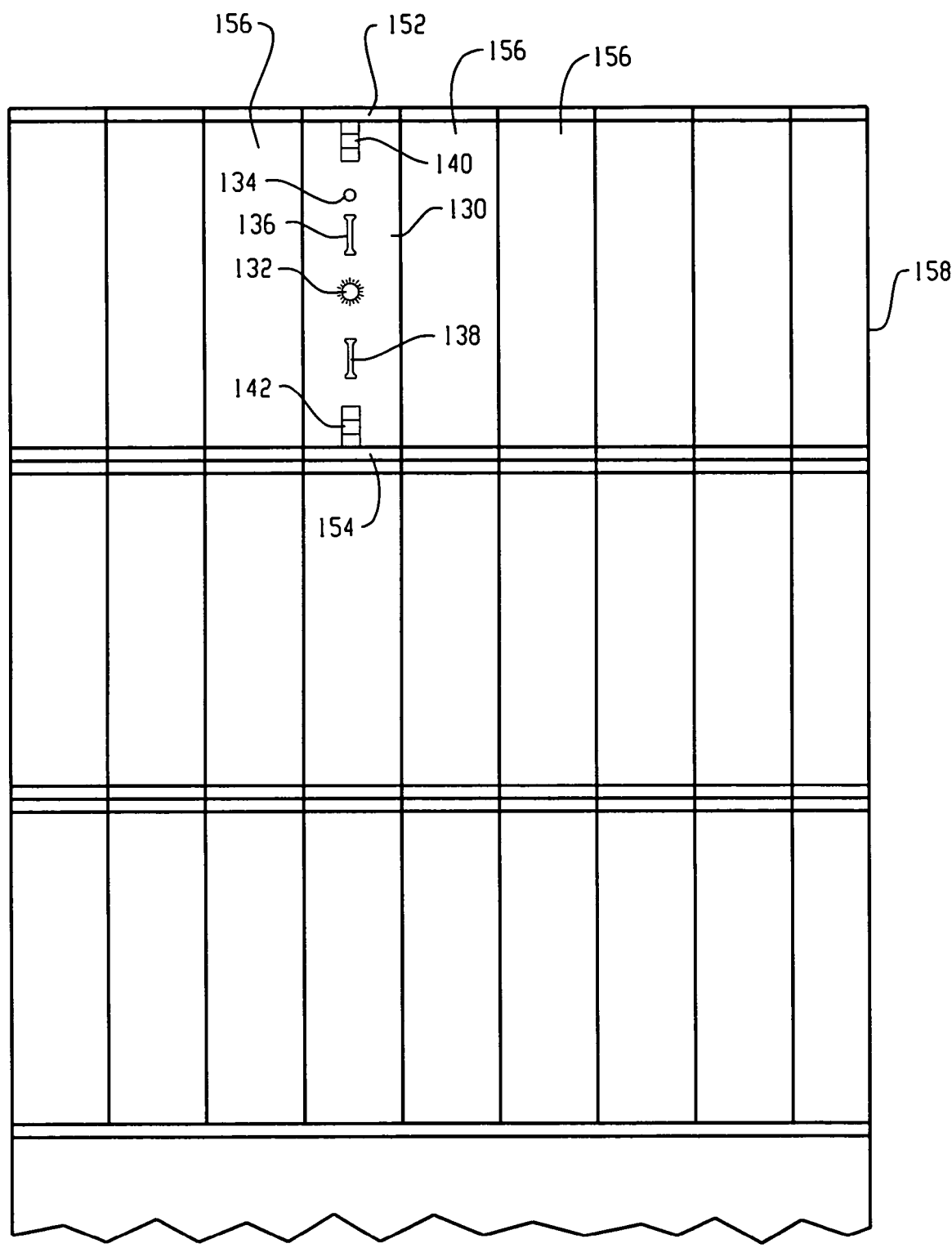
FIG. 6 is a front view illustration of a cabinet rack suitable for use in the datacenter of FIG. 1.

Referring to FIG. 6 which illustrates an exemplary cabinet rack of a server system, each rack 158 includes an upper retainer bar 152 and a lower retainer bar 154 respectively above and below the slots 156 thereof. When a unit is inserted into a slot 156 of the cabinet rack 158, the levers 146 of the upper and lower mechanisms 140 and 142, respectively, are held within their respective panel slot 144 either by friction or by a spring loading, for example. Once the unit is inserted into its rack slot 156, using the lips 148, the upper and lower levers 144 may be slid out from their respective panel slots 144 until the notched ends 150 thereof lock themselves onto the upper and lower retainer bars 152 and 154, respectively. Note that since the levers 146 may be under friction or spring loaded, some force may have to be exerted to the lip 148 to move the lever 146 from its initial position within the slot 144. The tapered end 150 will allow the lever 146 to slide across the respective retainer bar until the notch thereof is locked in place.

Referring back to FIG. 4B, each unit will include one or more connectors 160 and 162 at the rear of the unit for connecting physically and electrically to mating connectors at a server midplane or backplane in the cabinet rack. Accordingly, as the unit is inserted in its slot 156, the connectors 160 and 162 will mate with like connectors of the server's midplane or backplane. Thus, some force will have to be exerted in pushing the unit into the rack slot 156 to engage the connector pairs.

To extract a unit from its rack slot 156, the levers 146 of the mechanisms 140 and 142 will have to be unlocked from their locked positions as described above. One way to accomplish this is to depress the lipped edges 148 of both of the levers 146 horizontally against the panel which will force the notches thereof away from their locked positions. While pressed against the panel, the levers 146 may be slid back into their respective slots 144 using the lipped edges thereof. The tapered edges will assist in sliding the levers 146 past the retaining bars 152 and 154. Once the levers 146 are within their respective panel slots 144, they will be held in place by friction or a spring loading. Accordingly, the unit may be extracted from the rack slot 156. Note that some force may have to be exerted to disengage the rear connectors 160 and 162 from their mating connectors during the extraction.

Figure 5A:
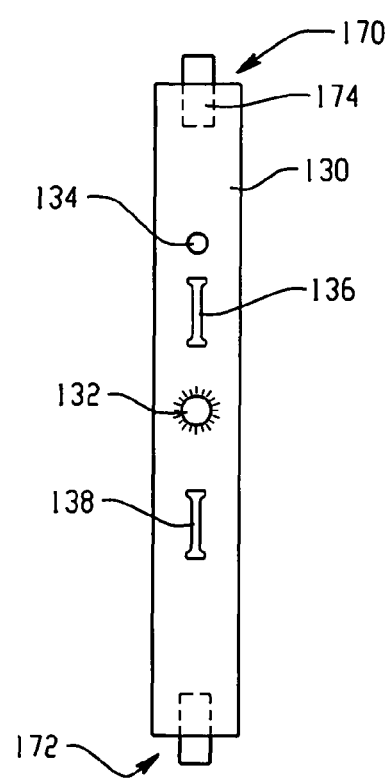
FIGS. 5A and 5B are front and side view illustrations, respectively, of an alternate cell unit also suitable for use in the datacenter of FIG. 1.
Figure 5B:
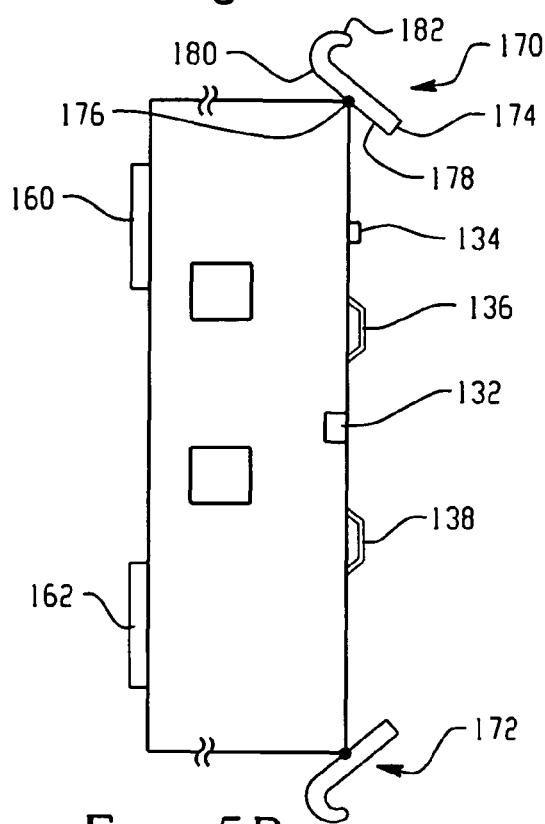

An alternate mechanical robotic interface mechanism for each unit is illustrated in the front and side views of FIGS. 5A and 5B, respectively. Except for the interface mechanisms 140 and 142, the alternate unit shown in the views of FIGS. 5A and 5B is substantially the same as the unit described in the views of FIGS. 4A and 4B. Therefore, like components between the two embodiments will retain their corresponding reference numerals and not be described again. Referring to FIGS. 5A and 5B, upper and lower alternate interface locking mechanisms 170 and 172, respectively, are provided at the front panel 130. Each mechanism 170 and 172 includes a lever 174 that is hinged at a pivot point 176, located at approximately the center of the lever 174. Pivot hinges for the levers 174 are positioned at the top and bottom edges of the front panel 130. A portion of the lever 178 on one side of the pivot point 176 pivots against and away from the front panel 130 and another portion of the lever 180 on the other side of the pivot point 176 pivots against and away from the top edge of the unit. The lever portion 180 has a curved and hooked edge 182.

Accordingly, when the alternate unit is inserted in its slot 156 (see FIG. 6) of the cabinet rack 158, the levers 174 of mechanisms 170 and 172 are pivoted so that portion 180 thereof lays against the top and bottom edges of the unit. The curved edges of portions 180 will allow the levers to slide across the retaining bars 152 and 154. Once the connectors 160 and 162 are engaged with their mates, the levers 174 of mechanisms 170 and 174 may be pivoted so that the portions 178 thereof lays against the front panel 130 and the hooked edge 182 of portions 180 lock onto the retaining bars 152 and 154, thus locking the unit in place in its slot 156. To extract the unit from its slot 156, the levers 174 of the mechanisms 170 and 172 are pivoted so that the portions 178 thereof are moved away from the front panel which unhooks the edges 182 from the retaining bars 152 and 154. Then, the unit may be slid out from its slot 156. Note the curved edges 182 of mechanisms 170 and 172 allow the levers to slid across the retaining bars 152 and 154 during unit extraction.

In either of the foregoing described unit embodiments, the grippers 84 and 86 of the robotic arm mechanism 62 (see FIG. 2A) may be controlled to perform the tasks of moving the lever mechanisms of the unit to insert and extract the unit into and from its rack slot 156. In addition, while only two types of robotic interfaces have been described herein above, it is understood that other types of robotic mechanical interfaces are possible without deviating from the broad principles of the present invention. Other physical orientations of the system cell units are possible as well. For example, system cell units may be contained in the system cabinet in a slide out drawer or in a horizontal position.

In one embodiment, the robotic vehicle 12 may be trained to extract and insert a system cell unit from and into the system cabinet based on the type, robotic interface and physical orientation thereof. In the training process, the robotic arm mechanism 62 of the RV 12 may be controlled through a set of movement steps for the extraction of a system cell unit from its system cabinet based on the type, robotic interface and physical orientation thereof. The same may be performed for the insertion of the unit. Each set of robotic arm movement steps may be saved in the form of a robotic task algorithm and classified as to unit type, robotic interface and physical orientation.

In the present embodiment, the DMS 14 may include a table of slot locations for each system cabinet in its database. For each cabinet slot, the corresponding table may include the type of unit disposed in the slot and the associated robotic interface and physical orientation thereof. The DMS 14 may then be pre-programmed to include in its memory a robotic task algorithm for each such unit type and physical orientation for robotic insertion and extraction operations thereof, i.e. the set of movement steps that the robot should exercise for the particular type unit. Each system cabinet table may be upgradable for new unit types, robotic interfaces and physical orientations. With each upgrade, the associated insertion and extraction robotic task algorithms are pre-programmed into the memory of the DMS 14. Accordingly, once the DMS 14 determines that a unit in a server system is to be replaced, it may use the corresponding table to establish the unit type and the associated robotic interface and physical orientation thereof and transmit the associated task algorithm(s). to the RV 12 for deployment.

Alternatively, the various extraction and insertion task algorithms associated with the different types of units, robotic interfaces and physical orientations may be pre-programmed into the RV 12 for storage in a local memory thereof. The RV 12 may retain a table in a local database which associates unit type, robotic interface and physical orientation with the task algorithm therefor. Then, the DMS 14 may only have to task the RV 12 with the unit that is to be replaced and its server location and the RV 12 will associate the proper task algorithm(s) with the unit to be replaced and carry out the steps thereof autonomously. As new unit types and associated robotic interfaces are developed and used in the server systems, the RV 12 may be trained with corresponding extraction and insertion robotic task algorithms therefor. The new task algorithms may be classified and saved and the tables of the RV 12 and DMS 14 may be updated accordingly to in turn associate them correspondingly with the new type units in its database table.

Figure 8A:
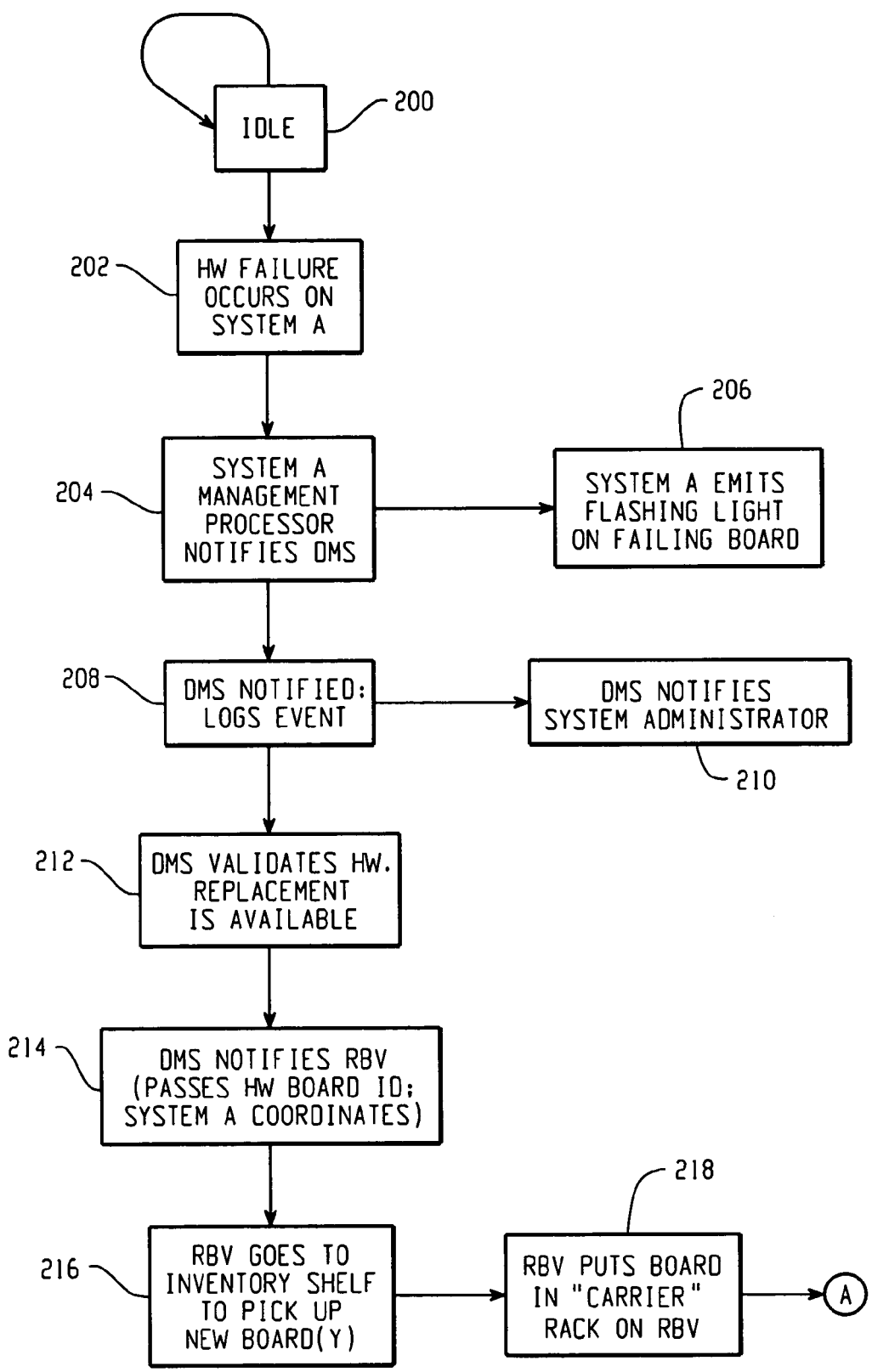
FIGS. 8A and 8B compositely depict a flowchart of exemplary operations of robotic maintenance of the datacenter of FIG. 1.
Figure 8B:
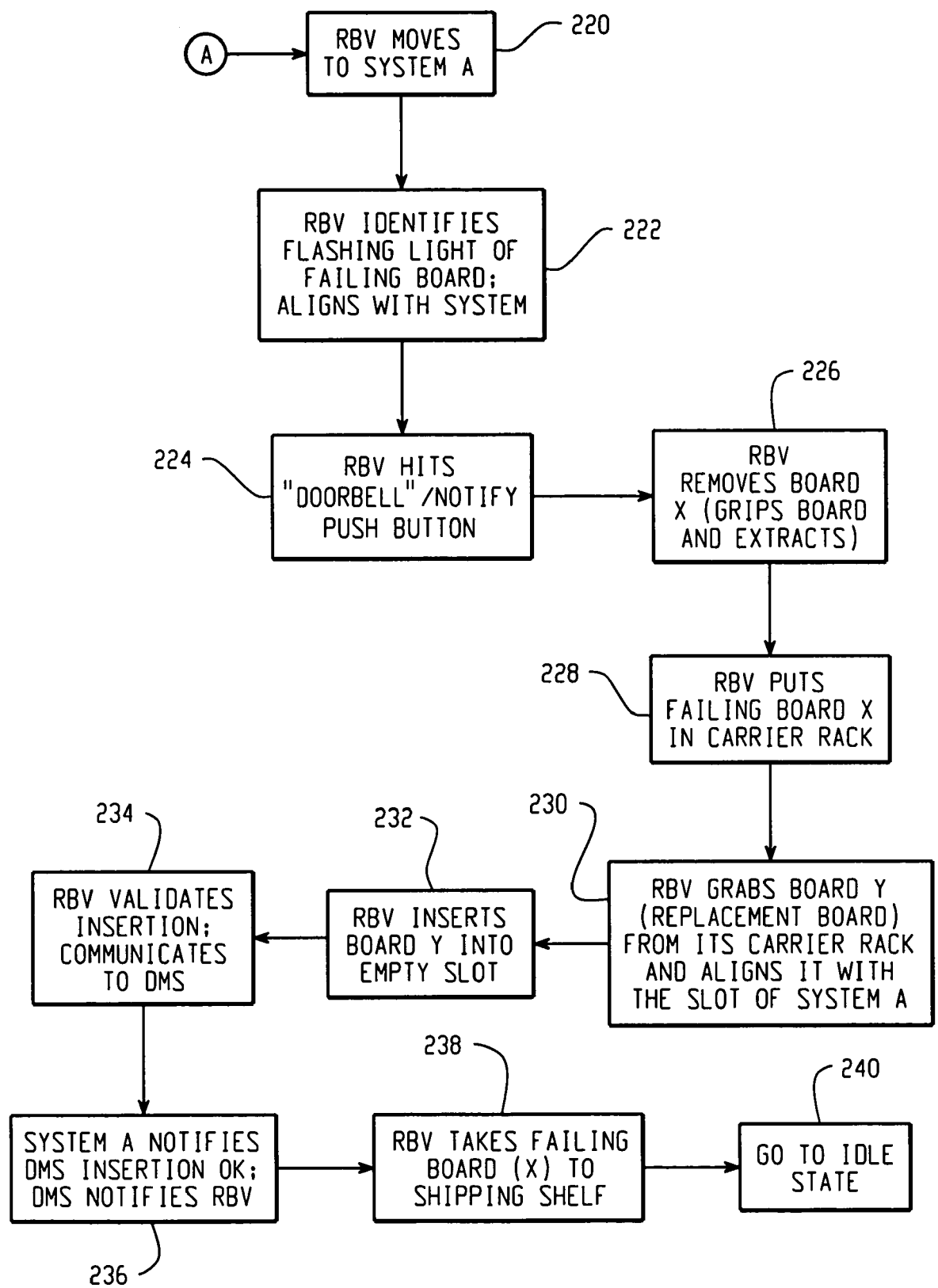

FIGS. 8A and 8B compositely depict a flowchart of exemplary operations of robotic maintenance of the datacenter 10. FIGS. 2A through 7 may be used in describing the steps of the composite flowchart. In FIGS. 8A and 8B, HW refers to a hardware unit of a server system; and RBV refers to the robotic vehicle 12. Also, wherever Board is used, it means a unit of the server system and not merely a board thereof. Referring to FIGS. 8A and 8B, in step 200 the DMS 14 and RV 12 remain idle waiting for a maintenance event to occur. In step 202, a failure occurs in a hardware unit of system A, which may be server S4 (FIG. 1), for example, and is detected by the MP unit 18 thereof. The MP 18 notifies the DMS 14 via link 20 of the failed unit and the type or ID thereof in step 204, and in step 206, the MP 18 may control the indicator 132 of the failed unit to flash.

In step 208, the DMS 14 logs the failure event in its database and may notify the system administrator of the event in step 210. In step 212, the DMS 14 validates that a replacement hardware unit is available at the inventory shelf 22. As noted above, the DMS 14 may maintain an inventory table in its database of the units stored at the inventory shelf 22 in which case, it may validate availability by looking up the failed unit in the inventory table. Otherwise, the DMS 14 may monitor the RFIC transmissions at the inventory shelf 22 to determine availability. If the replacement unit is available, the DMS 14 will notify the robotic vehicle 12 of the failure and download over link 46 the failed unit's ID and the location of the failed server S4 in the datacenter 10 in step 214.

In response, the RV 12 will be controlled to perform the task of retrieving a replacement unit from the inventory shelf in step 216. As noted above, the RV 12 will exercise the pre-programmed task algorithm by its processor 106 to control movement of the RV 12 to the inventory shelf along the track strip 48 using frame images of the camera 100. At the inventory shelf 22, the camera 100 of the RV 12 may be used to find the slot location of the replacement unit which may be accomplished through markings on the unit's front panel, like a bar code, for example. Alternatively, the RV 12 may track to the ID transmission of the RFIC 40 attached to the replacement unit.

In either case, once the unit's location is established, the camera 100 will focus on the replacement unit and another task algorithm may be exercised by the processor 106 to control the robotic arm mechanism 62 to remove the replacement unit from its inventory slot of shelf 22 and deposit it in one of the side carriers 52 or 54 of the RV 12 which is performed in step 218. In performing this task, the grippers 84 and 86 of the arm mechanism 62 may be controlled to grasp the respective handles 136 and 138 of the unit with the aid of the frame images of camera 100 as noted above. The movements of the robotic arm mechanism 62 to remove the unit from its slot of the shelf 22 and to place the retrieved unit into the side carrier cage 52 or 54 may be pre-programmed into the memory of the RV 12 as another task algorithm to be called upon and exercised by the processor 106 once the handles of the unit are identified as being gripped.

Once the replacement unit is safely contained in the side carrier of the RV 12, the processor 106 of the RV 12 may call upon and exercise another pre-programmed task algorithm utilizing camera 100 to control movement of the RV 12 along track 48 to the front of the failed server S4 in step 220 as described herein above. In the present embodiment, the frame images of the camera 100 may be utilized in controlling the RV 12 into proper alignment with respect to the failed server in step 222. When in proper alignment, the RV 12 may deploy the extender supports 92 and 94 against the front of the server cabinet as shown in the side view illustrations of FIGS. 9 and 10. Also in step 222, the RV 12 may identify the failed unit of the system server S4 by focusing the camera 100 on the flashing light 132 so that the failed unit is within a frame image of the camera 100. Thereafter, in step 224, the robotic arm mechanism 62 is controlled by the processor 106 and controller 114 utilizing the frame images of the camera 100 to move so that the gripper 84, for example, touches and depresses the notification pushbutton 134 on the panel of the failed unit which notifies the MP 18 that the failed unit is being removed.

Figure 9:
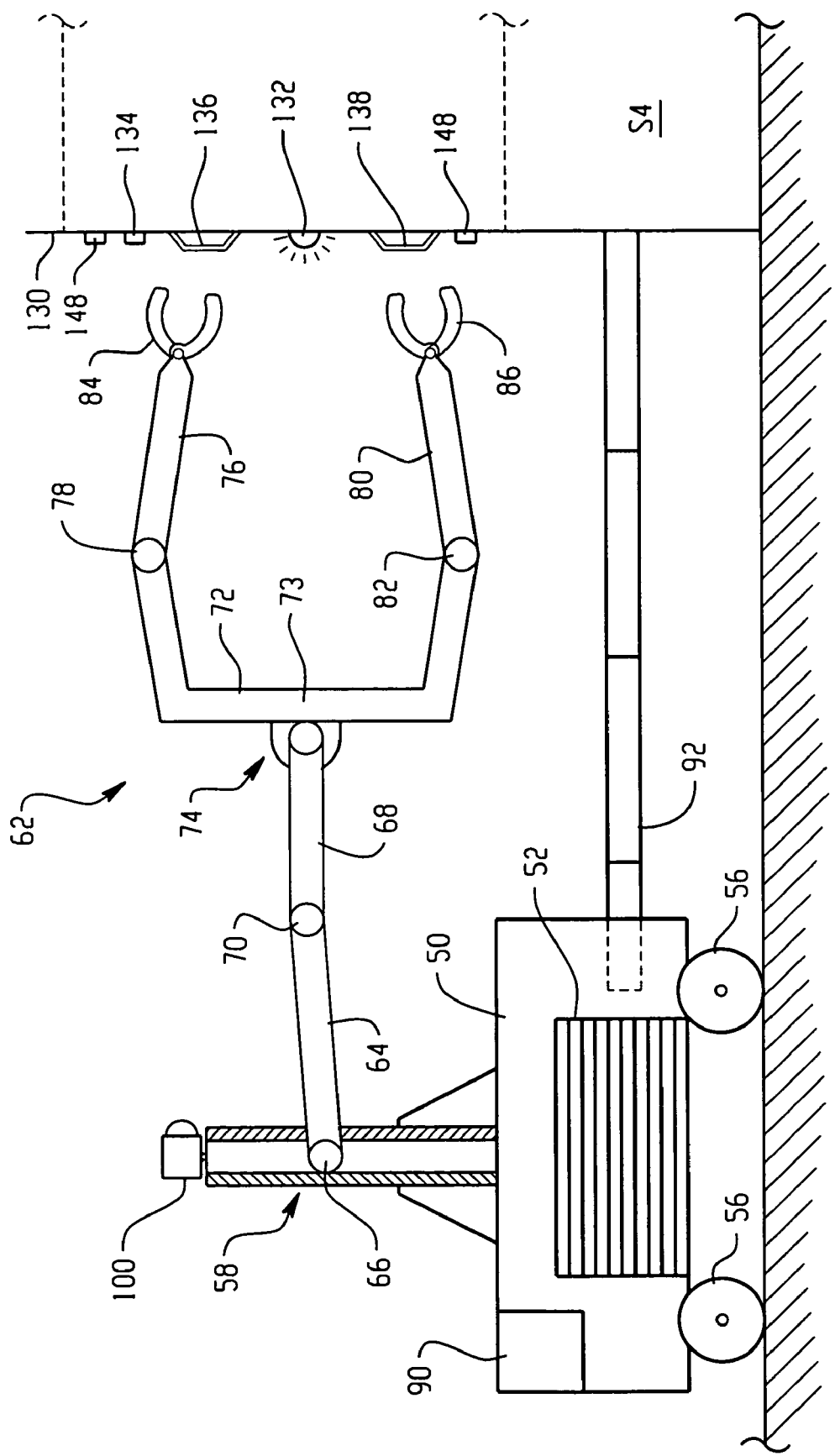
FIG. 9 is a side view illustration of a robotic vehicle in alignment with a cabinet rack of the datacenter for performing maintenance on a system cell unit thereof.
Figure 10:
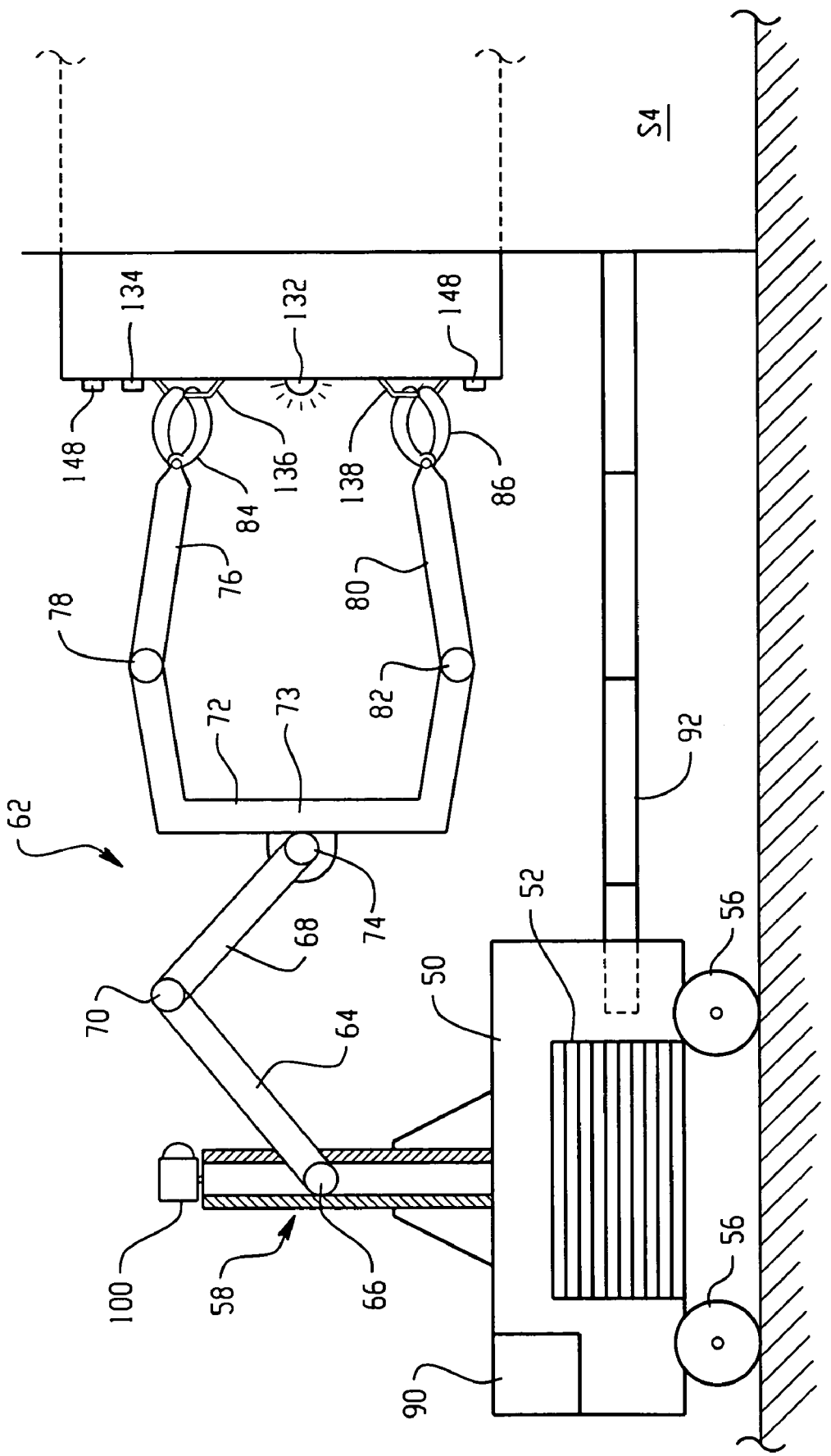
FIG. 10 is a side view illustration of a robotic vehicle in the process of performing maintenance on a system cell unit of a cabinet rack of the datacenter.

Then, in step 226, the arm mechanism 62 of the RV 12 is controlled via processor 106 and controller 114 to unlock and remove the failed unit from its slot in the system server. This may be accomplished by controlling the hands or grippers 84 and 86 of the arm 62 to unlock the lever mechanisms as described herein above, and then, grip the respective handles 136 and 138 of the failed unit as illustrated in FIG. 9 and controlling the arm mechanism 62 to extract the failed unit from its slot as illustrated in FIG. 10. Once the failed unit is removed from its slot, the processor 106 of the RV 12 may call and exercise a pre-programmed task algorithm in step 228 to control the arm 62 to put the failed unit in an empty side carrier rack.

Once the failed unit is safely stored in the designated carrier rack, the processor 106 of the RV 12 may call and exercise another pre-programmed task algorithm to control the arm 62 to grip and remove the replacement unit in the other side carrier rack and align it with the proper slot in the server system in step 230. The image frames of the camera 100 may be utilized by the processor 106 in controlling the arm 62 and replacement unit into alignment with the empty slot. After alignment, the arm mechanism 62 is controlled in step 232 to insert the replacement unit into the slot as shown in the sequence of illustrations of FIGS. 10 and 9. The RV 12 may communicate to the DMS 14 over link 46 that the replacement unit has been inserted into the server system S4 in step 234.

To sense completion of insertion, the RV 12 may include some form of tactile sensing in the arm mechanism 62 thereof. For example, insertion completion may be detected by the RV 12 when the insertion force sensed by the tactile sensor of the arm mechanism exceeds a preset limit. This limit should be sufficient to permit engagement of the rear connectors 160 and 162 of the replacement unit with their respective mating connectors of the mid-plane or backplane. The MP 18 of the server system may also detect that the replacement unit has been inserted and functioning and notify the DMS 14 via link 20 of the completion of unit insertion in step 236. Also in step 236, the DMS 14 may notify the RV 12 over link 46 that it has received confirmation from the server system that the insertion of the replacement unit was successful. Another way of accomplishing notification of the MP 18 of insertion completion is to control one of the hands 84 or 86 of the arm mechanism 62 to depress the notification pushbutton 134 on the panel 130 of the replacement unit.

Thereafter, the DMS 14 may issue a command to the RV 12 over link 46 to return the failed unit in its carrier rack to the shipping shelf 44 in step 238. In response, the RV 12 may be controlled to move to the shipping shelf 44 utilizing the tracking strip 48 as described herein above. Once aligned to the shipping shelf 44, the RV 12 may call and exercise another pre-programmed task algorithm in step 238 to control the arm mechanism 62 thereof through the movements of gripping the failed unit in the carrier rack and placing it on the shipping shelf 44. Thereafter, the RV 12 and DMS 14 will go idle in step 240 waiting for another maintenance action.

While the present invention has been described herein above in connection with one or more embodiments, it is understood that such descriptions were presented merely by way of example. Accordingly, the present invention should not be limited in any way by the various embodiments presented above, but rather construed in breadth and broad scope in accordance with the recitation of the claims appended hereto.

What is claimed is:

1. A datacenter with automated robotic maintenance, said datacenter comprising:
    a plurality of computer systems disposed at different locations therein, each system including: a cabinet rack; and a plurality of system cell units disposed therein for operation of the corresponding computer system;
    a robotic vehicle operative to move to each of the cabinet racks of said plurality and to perform maintenance on the system cell units thereof; and
    a central management station operative to communicate with said plurality of computer systems to determine an occurrence of a maintenance event for a system cell unit at one of the computer systems, and operative to direct said robotic vehicle to move to the cabinet rack of said one computer system and to perform maintenance on said system cell unit in accordance with said maintenance event.

2. The datacenter of claim 1 wherein each computer system operates as a computer server.

3. The datacenter of claim 1 wherein the central management station directs the robotic vehicle through a wireless communication link.

4. The datacenter of claim 1 wherein the central management station is operative to communicate with the plurality of computer systems to determine a malfunctioning system cell unit at one of the computer systems, and operative to direct the robotic vehicle to move to the cabinet rack of said malfunctioning system cell unit and to replace said malfunctioning system cell unit with a replacement system cell unit.

5. The datacenter of claim 4 wherein each cabinet rack of a computer system includes a plurality of slots for containing correspondingly said plurality of system cell units thereof; and wherein the robotic vehicle includes a robotic arm mechanism operative to extract the malfunctioning system cell unit from the corresponding slot thereof and to insert the replacement system cell unit into the corresponding slot.

6. The datacenter of claim 4 including an inventory area for storing an inventory of system cell units; and wherein the central management station is operative to determine whether or not a replacement for the malfunctioning system cell unit is in said inventory area.

7. The datacenter of claim 6 wherein the system cell units are of different types; wherein each system cell unit in the inventory area includes a circuit for transmitting a type identifier thereof; and wherein the central management station is operative to receive said type identifier transmissions to determine the types of system cell units in the inventory area.

8. The datacenter of claim 7 wherein each transmitting circuit comprises a programmable radio frequency transmitting integrated circuit.

9. The datacenter of claim 7 wherein the central management station is operative to establish a table of different types of system cell units in the inventory area based on the received identifier transmissions.

10. The datacenter of claim 6 wherein the central management station is operative to direct the robotic vehicle to the inventory area and to collect a replacement for the malfunctioning system cell unit from the inventory area.

11. The datacenter of claim 10 wherein the robotic vehicle includes a container for carrying the collected replacement system cell unit to the computer system with the malfunctioning system cell unit.

12. The datacenter of claim 4 wherein the robotic vehicle includes a central processor system pre-programmed with algorithms for controlling the performance of tasks of the robotic vehicle.

13. The datacenter of claim 4 wherein the robotic vehicle includes a central processor system and an image generating device for generating electronic image frames of a view that is under control of said central processing system, said image frames being utilized by said central processing system to control performance of tasks of the robotic vehicle.

14. The datacenter of claim 13 including a tracking strip disposed on a floor of the datacenter along paths running to the computer systems; wherein the image generating device is operative to view and generate image frames of said tracking strip; and wherein said tracking strip image frames are utilized by said central processing system to direct movement of the robotic vehicle from one location to another in the data center.

15. The datacenter of claim 4 wherein each computer system includes a management processor for detecting a malfunctioning system cell unit of the computer system, each management processor operative to alert the central management station of the malfunctioning system cell unit over a communication link.

16. The datacenter of claim 1 wherein the robotic vehicle is trainable to learn movement along a plurality of different datacenter paths.

17. The datacenter of claim 1 wherein the robotic vehicle is trainable to establish robotic task algorithms for performing maintenance on the system cell units based on physical characteristics and cabinet rack locations thereof.

18. The datacenter of claim 17 wherein the robotic vehicle is operative to perform maintenance on the designated system cell unit using the established robotic task algorithm corresponding thereto.

19. A datacenter with automated robotic maintenance, said datacenter comprising:
    a plurality of computer systems disposed at different locations therein, each system including: a cabinet rack; and a plurality of system cell units disposed therein for operation of the corresponding computer system;
    a robotic means for moving to each of the cabinet racks of said plurality and for performing maintenance on the system cell units thereof; and
    a central management means for communicating with said plurality of computer systems to determine a maintenance event for a system cell unit at one of the computer systems and for directing said robotic means to move to the cabinet rack of said one computer system and to perform maintenance on said system cell unit in accordance with said maintenance event.

20. Method of maintaining a datacenter with an automated robotic vehicle, said method comprising:
    communicating with a plurality of computer systems disposed at different locations in the datacenter to determine an occurrence of a maintenance event for a system cell unit of one of the computer systems of the plurality;
    directing a robotic vehicle to move to said one computer system; and
    directing the robotic vehicle to perform maintenance on said system cell unit of the one computer system.

21. The method of claim 20 including:
    communicating with the plurality of computer systems to determine a malfunctioning system cell unit of one of the computer systems of the plurality;
    directing the robotic vehicle to move to the computer system of the malfunctioning unit; and
    directing the robotic vehicle to replace the malfunctioning system cell unit with a replacement system cell unit.

22. The method of claim 21 including:
operating a robotic arm mechanism of the robotic vehicle to extract the malfunctioning system cell unit from a slot in a cabinet rack of the one computer system; and
operating the robotic arm mechanism to insert the replacement system cell unit in a corresponding slot of said cabinet rack.

23. The method of claim 21 including:
determining if a replacement system cell unit is in an inventory area of the datacenter;
directing the robotic vehicle to the inventory area to collect the replacement system cell unit; and
directing the robotic vehicle to carry the replacement unit to the one computer system for replacement of the malfunctioning cell unit.

24. The method of claim 21 including directing the robotic vehicle to carry the malfunctioning unit to a shipping area of the datacenter.

25. The method of claim 20 including training the robotic vehicle to learn movement along a plurality of different datacenter paths.

26. The method of claim 20 including:
training the robotic vehicle to establish robotic task algorithms for performing maintenance on the system cell units based on physical characteristics and cabinet rack locations thereof; and
performing maintenance on the system cell unit of the one computer system using the established robotic task algorithm corresponding thereto.

* * * * *